United States Patent [19]

Righter

[11] Patent Number: 5,519,333
[45] Date of Patent: May 21, 1996

[54] ELEVATED VOLTAGE LEVEL $I_{DDQ}$ FAILURE TESTING OF INTEGRATED CIRCUITS

[75] Inventor: Alan W. Righter, Albuquerque, N.M.

[73] Assignee: Sandia Corporation, Albuquerque, N.M.

[21] Appl. No.: 303,849

[22] Filed: Sep. 9, 1994

[51] Int. Cl.[6] .................................................. G01R 31/26
[52] U.S. Cl. ........................................... 324/765; 324/537
[58] Field of Search ................................ 324/537, 760, 324/765, 158.1; 371/22.1, 22.5

[56] References Cited

U.S. PATENT DOCUMENTS

| | | | |
|---|---|---|---|
| 5,025,344 | 6/1991 | Maly et al. | 324/73.1 |
| 5,057,774 | 10/1991 | Verhelst et al. | 324/537 |
| 5,332,973 | 7/1994 | Brown et al. | 324/537 |

Primary Examiner—Ernest F. Karlsen
Assistant Examiner—Russell M. Kobert
Attorney, Agent, or Firm—Gregory A. Cone

[57] ABSTRACT

Burn in testing of static CMOS IC's is eliminated by $I_{DDQ}$ testing at elevated voltage levels. These voltage levels are at least 25% higher than the normal operating voltage for the IC but are below voltage levels that would cause damage to the chip.

16 Claims, 1 Drawing Sheet

ELEVATED VOLTAGE LEVEL $I_{DDQ}$ FAILURE TESTING OF INTEGRATED CIRCUITS

BACKGROUND OF THE INVENTION

This invention was made with Government support under Contract DE-AC04-94AL85000 awarded by the U.S. Department of Energy. The Government has certain rights in this invention.

This invention relates to failure analysis testing of integrated circuits. More specifically it relates to a process for such testing utilizing overstressing with $I_{DDQ}$ testing.

Currently, accelerated life testing (burn-in) is performed on static CMOS products (and other technology products) to remove defective product from shipment. Depending on the length of burn-in time and number of parts burned in, anywhere from 5% to 40% of the cost of producing the device comes from this accelerated testing. In order to become more competitive in the marketplace, studies are focusing on reduction of burn-in. If a way could be found to eliminate burn-in for a particular device technology, not only would it increase the profit earned per device, but that technology would immediately be more desirable to design with, to leverage the maximum profit per device.

Over the last 15–20 years, research has shown that for fully static CMOS-designed devices having no additional background current, quiescent power supply current ($I_{DDQ}$) testing is a very effective detection method for screening out those fully static CMOS devices containing defects such as gate oxide shorts, stuck-at (nodes incorrectly tied to logic 0 or 1) defects, bridging (neighbor nodes accidentally tied together) defects, leaky p/n junctions (high reverse-bias leakage current), some forms of open circuits (disconnects in metal or polysilicon), low threshold voltages in transistors, and punch through (drain and source of a transistor connect, rendering the transistor always on). By way of explanation, fully static means that the device can operate down to zero hertz and not lose functionality. No additional background current means that the fully static CMOS device only draws current in its quiescent or steady state due to the reverse-bias pn junction leakage of transistors and not from any pull up or pull down passive resistor-like transistors, resistors, or designed-in process transistor pre-threshold conduction.

At this point, a general discussion Of $I_{DDQ}$ testing is appropriate. $I_{DDQ}$ testing works on the fact that for a fully static CMOS device, when the device is in a quiescent state (all circuit nodes have voltages settled to a steady-state value) the current drawn is in the low nA range. The power supply voltage level of the device must be the same level as the logic level "1" for the input pins. (If supply is at 5.50 volts, logic 1 inputs must be at 5.5 V.) When a logic transition is applied to a device, as shown in FIG. 1A, a momentary period of time (less than 1 microsecond) occurs when both the complementary n- and p- transistor network in the device is turned on, creating a low-impedance path between $V_{DD}$ and ground ($V_{SS}$). Q1 is a p-type transistor, and Q2 is an n-type transistor as shown in FIGS. 1A and 2A. The current during this brief time can be hundreds of milliamps or even amps. This is the $I_{DDT}$ value ($I_{DDT}$ is an arbitrary acronym for this transient current spike). Within about a microsecond, one or the other (either the n- or the p-transistor in this example, can vary throughout the CMOS circuit network) will assert itself and the opposite polarity transistors will turn off. The current will settle down (once any parasitic capacitances have discharged) to a steady state current or $I_{DDQ}$ as shown in FIG. 1B.

If a defect (FIG. 2A shows a gate-to-source oxide short 20 in the n-channel transistor as an example) is present, then activation of that defect will occur when the $V_{in}$ to that input pin is at a logic 1. This will create a low-impedance path from $V_{DD}$ to $V_{SS}$ which may contribute significant current in the quiescent state (note the elevated $I_{DDQ}$ in FIG. 2B). Because the noise margin of the CMOS device is so high, the device may still work, and an acceptable voltage at $V_{out}$ may be obtained. However, defects such as gate oxide shorts often become worse over time and can result in complete logic failure.

The timing of the $I_{DDQ}$ measurement per vector is dependent upon the CMOS circuit and the tester environment hooking up to the device. In FIGS. 1A and 2B, the transient spike ($I_{DDT}$) can decay within a microsecond, however, any PMU (parametric measurement unit) or $I_{DDQ}$ measurement equipment hooked up to the tester adds RC settling time delay as well as inductance. This can increase the settling time from under a microsecond to hundreds of microseconds or even milliseconds. Off-chip $I_{DDQ}$ measurement circuitry has been designed to reduce this settling time, but it is still on the order of 2–10 µs. The $I_{DDQ}$ measurement strobe (measurement time) is placed as close to the end of the vector time as possible (2–5 microseconds before the next input change with state of the art measurement equipment). Typical tester vector rates for $I_{DDQ}$ measurement are on the order of 1–100 kHz, but PMU measurements are even slower (10–100 per second).

Sandia National Laboratories has used conventional $I_{DDQ}$ testing since the middle 1970's to screen out defective fully static CMOS integrated circuits from shipment. Devices exhibiting higher than 50–100 µA quiescent current consumption were removed from shipment, since for battery-powered operation in space and weapon applications this was not acceptable.

Sandia National Laboratories has used a variety of off-chip methods to measure $I_{DDQ}$, including diode-resistor and FET-resistor circuits which had lower current measurement limits of 50–100 µA but had operating speeds up to 1 MHz. These methods could detect gross stuck-at 1 or 0 failures, but not many process defects.

In the 1980's, research by Jerry Soden of Sandia National Laboratories and Chuck Hawkins of the University of New Mexico showed that there were many types of defects which could occur in CMOS IC's, which were not explained by the widely used stuck-at fault model used at that time in vector sets to screen out CMOS devices. Moreover, these defects had a large effect on CMOS IC reliability in that they could still permit correct logical operation of the IC but would degrade over time. These defects were able to be detected by $I_{DDQ}$ testing. Such defects include gate oxide shorts, some forms of open circuits, leaky p/n junctions and bridging defects. Through this research, it was found that if a vector set which toggled 100% of all logical nodes in a static CMOS circuit to a logic 0 and a logic 1 was input to the IC and $I_{DDQ}$ was measured for every vector on a per-vector basis, this test would detect 100% of stuck-at faults, 100% of gate oxide shorts, and those bridging defects exposed when driven two neighbor nodes to opposite logic values (not all of these can be driven).

Sandia has also used $I_{DDQ}$ testing in a low level stress condition to remove defective static CMOS IC's prior to device burn-in. For one static CMOS IC (the Sandia radiation-hardened version of the Intel 80C51 microcontroller) a high activation $I_{DDQ}$ vector set was run first at 5.5 V (a normal voltage), then at 6.5 V (<25% increase from nominal voltage), then again at 5.5 V. It is normal for the IC to have a larger current consumption at 6.5 V, but it should still be under 1 microamp. However, if the 6.5 volt test shows an $I_{DDQ}$ measurement > 1 µA or if the second 5.5 volt $I_{DDQ}$ test showed an increase in current over the first 5.5 V $I_{DDQ}$ test (first under 1 µA and second over 1 µA) the device was considered to have a defect and removed.

In 1992, a paper was published discussing reliability benefits of $I_{DDQ}$ (S. McEven, "Reliability Benefits Of $I_{DDQ}$, J. Electron Testing: Theory and Applications, Vol. 3, pp. 327–335, 1992). In it the author described how that implementation of $I_{DDQ}$ testing (a limit of 10 µA at room temperature, no supply voltage specified) was beneficial in reducing burn-in failures (51% fewer burn-in rejects). In summary the author wrote:

> Present $I_{DDQ}$ data do not support the elimination of FMI's (Ford Microelectronics Inc.) burn-in. On the contrary, burn-in has aggravated hidden defects that have resulted in new post-burn-in $I_{DDQ}$ failures. The primary cause of this is believed to be the voltage acceleration present during burn-in (reference mentioned in paper). If the voltage stress seen during burn-in were included in the testing of the device along with an $I_{DDQ}$ screen, then the possibility exists for burn-in to change its form. This new form could then focus more on package-related problems such as a thermal cycle test would do.

SUMMARY OF THE INVENTION $I_{DDQ}$ testing of static CMOS IC's at elevated voltage levels can be used to find defects that are not otherwise detectable and can be substituted for burn-in testing when properly validated by a manufacturing test program. These voltage levels are at least 25% higher than the normal operating voltage for the IC but are below voltage levels that would cause damage to the chip. The elevated voltage levels are determined from CMOS process parameters and tester characterization.

The testing is done by measuring $I_{DDQ}$ for each vector value within a vector set, which is designed to toggle each node in the IC on and off and to test as many of the bridges between nodes as possible by driving the nodes on either side of a bridge to opposite logic values. Chips are passed or rejected on the basis of the measured $I_{DDQ}$ values. A number of pass/reject strategies may be employed. With the present state of the art, a good CMOS chip will have $I_{DDQ}$ values substantially below 1 µA. This 1 µA can be used as a maximum permissible $I_{DDQ}$ value.

Normally, $I_{DDQ}$ testing is first done by running the vector set at normal voltage levels. If any $I_{DDQ}$ value for this first vector set exceeds the rejection current level, i.e. 1 µA, it is rejected.

If the $I_{DDQ}$ current values are below the rejection values, they are recorded for comparison to later $I_{DDQ}$ testing. The detection of failures at this normal or slightly above (<25%) normal voltage vector set level is within the prior art and does not constitute the invention herein.

These steps are then followed by stressing of the IC at voltages that are greater than 25% higher than the normal operating voltage. There may be several tests at different higher levels, but none at a level that would overstress or damage a good IC. (Again, voltages are carefully first determined from CMOS parameters and tester characterization.) The $I_{DDQ}$ values at these higher voltages will be higher than those at the normal voltage levels even for good chips, but any chip above a predetermined failure $I_{DDQ}$ value, i.e. 1 µA, will be rejected. By "predetermined" I mean: The voltage level for stress must be characterized with the device connected to the tester and the $I_{DDQ}$ value measured such that for a "defect free" device the current is elevated but still below the levels that would be caused by defects in the circuit. "Good levels" will vary with the particular device but generally under 500 to 700 nA. After the elevated voltage stress testing, another vector set test may be conducted at normal voltage. If the $I_{DDQ}$ values have increased from the prior nominal vector set values to readings greater than the limit, this also can be used as a basis to reject the chip.

In order for this $I_{DDQ}$ testing to have sufficient confidence to allow the omission of subsequent burn-in testing in a production environment, the $I_{DDQ}$ testing process must be validated in conjunction with subsequent burn-in testing. An example of this validation process is provided below. Once properly validated, however, the elevated voltage stress testing and $I_{DDQ}$ measurements of this invention allow for the omission of burn-in testing in the production of static CMOS IC's.

The basis of the invention is as follows:

When properly characterized and validated by burn-in and post burn-in manufacturing electrical testing:

Proper voltage stressing of static CMOS IC's will stress and/or accelerate already present defective areas of devices just enough to enable detection of the defects using high resolution current measurement (with measurement resolution in the nA range and $I_{DDQ}$ limit at or under 1 µA).

When performed as part of a normal pre-burn-in manufacturing electrical test, addition of this test procedure will eliminate the need for a much longer time burn-in applied to accomplish the same thing.

DETAILED DESCRIPTION OF THE INVENTION

Figure 1A:
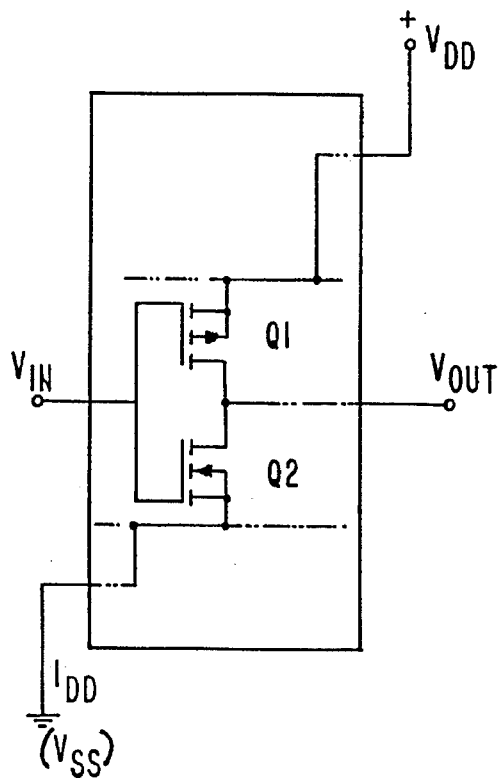
FIG. 1A depicts a portion of a good IC showing a CMOS transistor pair with their inputs and outputs.
Figure 1B:
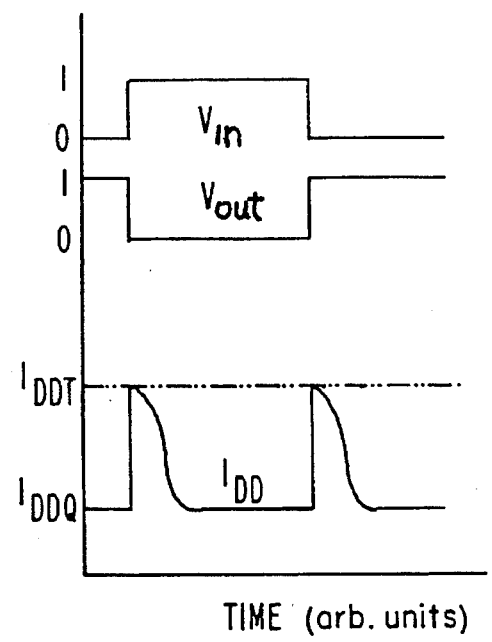
FIG. 1B is a pair of graphs showing the voltage and current parameters for the transistor pair in FIG. 1A.
Figure 2A:
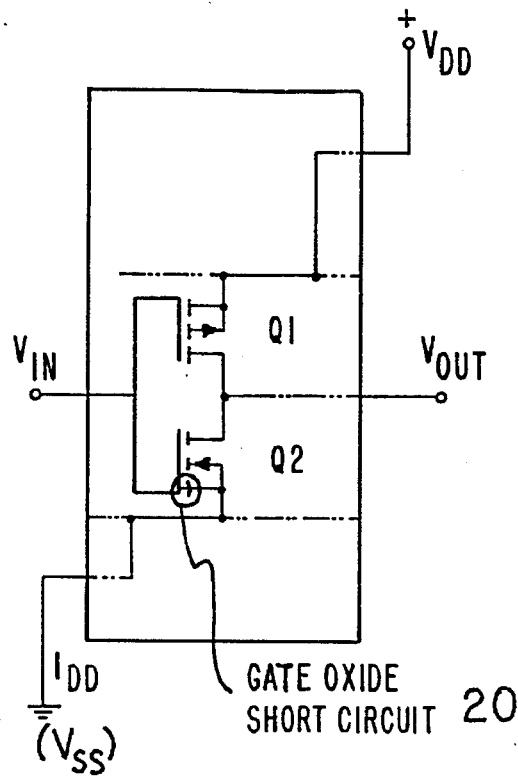
FIG. 2A is similar to FIG. 1A but with a defect in the n-type transistor.
Figure 2B:
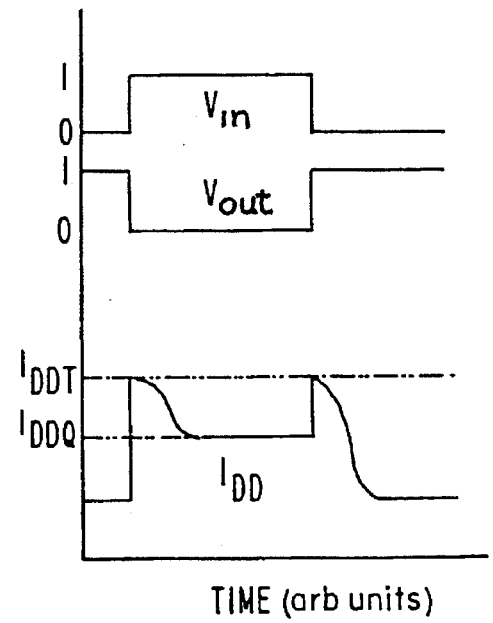
FIG. 2B is a pair of graphs showing voltage and current parameters for the defective CMOS transistor pair in FIG. 2A.

The following tests were conducted as one example of the invention. The reader will understand, however, that the true scope of the invention is defined by the appended claims.

These tests were run on a SA3865 Sandia radhard (emulation of an Intel 80C51 microcontroller) chip at Sandia National Laboratories. Preliminary functionality tests were run as well as an $I_{DDQ}$ test at the normal 5.5 voltage. Then, the stress $I_{DDQ}$ test (using a >97% node toggle coverage vector set), which was a subset of the nominal $I_{DDQ}$ vector set run pre- and post-burn-in, was run at stress voltages of 6.5 V, 7.0 V, 7.5 V and 8.0 V; then at the normal 5.5 volts. The SA3865 was reset to a known device state ensuring the device was exercised the same way with all vector sets for each run. During each of these tests, the first 99 (vectors 2 through 100) were written out (the $I_{DDQ}$ measured value and vector number) and also any vectors with values of $I_{DDQ}$ over 250 nA were written out by value and vector number. This was to see if the stress voltage somehow raised the nominal value of $I_{DDQ}$ for good vectors to a higher value (raised the noise floor to 100–200 nA, for example, or even greater, which would be indicative or overstress).

Since all parts stress-tested above have already passed an initial electrical test prior to the stress $I_{DDQ}$ test, whatever fails will be a result of the stress $I_{DDQ}$ test. The object was to stress defective parts to exhibit defective behavior while leaving the good parts good. Parts passing all tests (or all tests except $I_{DDQ}$) were then burned in and retested at a nominal normal voltage to validate this $I_{DDQ}$ testing procedure.

Of all of these devices (tested for stress to expose and detect defects), all 58 passed initial function testing, retention testing, reset operating current testing, and DC, AC and maximum frequency testing.

Four devices failed tests as a result of the stress $I_{DDQ}$ testing. None of the 58 devices saw a change in maximum operating frequency, $V_{IL}/V_{IH}$ readings, or AC and DC measurements. This indicated that the stress testing did not over stress good devices and that the test was likely picking up the defects that were sought.

The 58 devices were then burned in using an Advanced Microtechnology Optimum 300 burn-in system capable of doing dynamic burn-in. In the dynamic burn-in, the exact same vector set was used to stimulate the devices as was used in the stress $I_{DDQ}$ test. The devices were checked in the oven at the start of burn-in to see that an initial reset of the devices was successful and that the vector set was exercising the parts. This burn-in was scheduled to run for a minimum of 120 hours at a supply voltage of 6.5 volts and a minimum of 150 degrees C.

Burn-in was performed on the devices for 140.1 hours at 6.5 V, 150 C. The devices were tested at Sandia National Laboratories the day after they were removed from the oven.

Part 1058 failed $V_{DD}$ continuity test on pin 12 initially. (It was retested at nominal voltage later and found to pass.) All other devices passed the post-burn-in testing with the exception of three devices having higher-than-normal $I_{DDQ}$ in the pre-burn-in $I_{DDQ}$ testing. "Defect-free" devices had stress $I_{DDQ}$ vector value measurements at 5.5 Volts from 10–60 nA and stress $I_{DDQ}$ vector value measurements at 8.0 Volts from 300–400 nA over all vectors in the set (Important). The stress $I_{DDQ}$ failing parts measured as follows:

Part 1039 had a maximum stress $I_{DDQ}$ reading at 5.5 V of 960 µA and a maximum $I_{DDQ}$ reading at 8.0 V of 7.24 mA. The post-burn-in nominal IDDQ binned at 1 mA.

Part 1043 had a maximum stress IDDQ reading at 5.5 V of 52 nA and a maximum $I_{DDQ}$ reading at 8.0 V of 378 µA. The post-burn-in nominal $I_{DDQ}$ binned at 1 µA.

Part 1069 had a maximum stress $I_{DDQ}$ reading at 5.5 V of 324 µA and a maximum $I_{DDQ}$ reading at 8.0 V of 800 µA. The post-burn-in nominal $I_{DDQ}$ binned at 500 µA.

Part 1085 had a maximum stress $I_{DDQ}$ reading at 5.5 V of 1.32 µA and a maximum $I_{DDQ}$ reading at 8.0 V of 3.83 µA. The post-burn-in nominal $I_{DDQ}$ binned at 1 µA.

There were no devices that failed tests other than $I_{DDQ}$ without $I_{DDQ}$ failing also. The only condition (test) failing so far was the stress $I_{DDQ}$ test. This indicated that the testing was not stressing good parts to failure by other mechanisms, which was what was intended. Also, nominal $I_{DDQ}$ values pre- to post-burn-in for defect-free parts showed no change. $V_{IH}$ and $V_{IL}$ tests, maximum frequency and other DC and AC tests compared pre- to post-burn-in showed no change. The stress $I_{DDQ}$ test so far has not stressed any parts to functional failure as well as $I_{DDQ}$ failure. For the static CMOS devices tested, not all parts failing $I_{DDQ}$ will fail other tests. But most failure mechanisms will show increased current, and can lead to device functional failure at a later time. For battery-powered applications, devices exhibiting high current are removed from shipment if detected.

From the data above, two devices stand out. Part 1043 passed the pre-stress nominal $I_{DDQ}$ test, binning at 1 µA (no vectors measured greater than 1 µA). However, the stress $I_{DDQ}$ test at 8 Volts measured 378 µA, and the post-burn-in nominal value binned at 1 µA. The 8 Volt stress value was 3 orders of magnitude greater than data measured for defect-free parts, thus failed the test.

This is an unexpected, surprising result. This indicates that not only did the stress $I_{DDQ}$ test detect the failed device prior to burn-in, but burn-in did not expose the defect. Part 1085 showed similar results in that the pre-burn nominal $I_{DDQ}$ test measured $I_{DDQ}$ under 1 µA and stress $I_{DDQ}$ at 8 Volts of 3.83 µA, with post-burn-in nominal $I_{DDQ}$ binning of 1 µA. The 8 Volt stress value in this case was one order of magnitude higher than for the defect-free devices. This indicates that the stress $I_{DDQ}$ test is more sensitive to exposing and detecting defects than the burn-in test. Again, the devices did not fail any other tests pre- and post-burn in.

In summary, stressing voltages up to 8 V, then going back to 5.5 V did not introduce additional failure mechanisms different from those intended to be exposed and detected for this SA3865 part type. High current parts can be detected prior to burn-in, and burn-in has not seemed to cause additional parts to fail $I_{DDQ}$ or any other functional test, if the stress $I_{DDQ}$ test is run prior to burn-in.

The maximum frequency of the parts was in the range of 20 to 21.3 MHz. The pre- and post-burn-in results nearly overlay each other. Stress $I_{DDQ}$ or burn-in did not affect maximum frequency.

Also, the VIL and VIH tests pre- and post-burn-in showed good agreement. They all passed and did not change pre to post. From this it can be concluded that for an 5 V $V_{DD}$-designed part such as the SA3865 with oxide breakdown voltages of 11 V or better and good immunity to transistor hot carrier effects, that a stress $I_{DDQ}$ test of $V_{DD}$ up to 8 V (60% above $V_{DD}$) does not damage good parts.

For these tests, the following order was:
1) Continuity
2) Stress
3) Functional
4) Other $I_{DD}$ and nominal $I_{DDQ}$ tests
5) DC tests ($I_{IL}$, $I_{IH}$, $V_{IL}$, $V_{IH}$, $V_{OL}$, $V_{OH}$)
6) AC tests
7) Maximum frequency Early on in the experimental procedure, the parts should be run initially using normal manufacturing electrical testing procedures, including $I_{DDQ}$ if available at nominal voltage to screen for other failure modes before running any of the more complicated stress $I_{DDQ}$ tests.

Then, the stress $I_{DDQ}$ tests are done and are characterized for different voltages. The stress time (over the stress IDDQ vector set) can vary from ~1 second up to 2 minutes, depending on characterization or production environments. The initial electrical test at nominal voltage is run afterwards to verify that good parts have not been overstressed and that good parts pass in a similar way to the first initial electrical test run at the nominal voltage.

At this point some parts have been identified that fail only $I_{DDQ}$ using the stress test (they may fail the nominal voltage $I_{DDQ}$ afterwards), and pass all other tests. The $I_{DDQ}$ stressing procedure is then validated by burn-in testing of the good parts and the ones failing $I_{DDQ}$. Post-burn-in testing (nominal-voltage stress $I_{DDQ}$ vectors and other $I_{DDQ}$ tests can be included) should then be run to ensure that no other parts fail that weren't detected by $I_{DDQ}$ beforehand and to see if other tests are failed as well as $I_{DDQ}$ on the high $I_{DDQ}$ parts after burn-in. The devices that failed stress $I_{DDQ}$ and either passed or failed nominal voltage stress vector set $I_{DDQ}$ are removed from shipment, as well as other failures.

Some comments regarding voltage-induced acceleration of time-dependent defect failures are useful at this point. In burn-in, two acceleration factors exist: a temperature acceleration factor and a voltage acceleration factor. The generally accepted equations relating the time acceleration are:

$$A_t = e^{[\frac{E_a}{kT_0} - \frac{E_a}{kT_S}]} \text{ (temperature)}$$

$$A_v = e^{\beta[V_S - V_0]} \text{ (voltage)}$$

As processes in microelectronics have become more refined and dense, they have become cleaner. The silicon is purer and the contamination issues have been reduced. Time-dependent dielectric breakdown (TDDB), leading to gate oxide failures, has an activation energy of ~0.3 eV. The $\beta$ value in the $A_V$ equation was experimentally determined to be ~2 for a state of the art process at Micron.

Typically, military burn-in is performed at 6.5 V, 150° C. The acceleration factors are:

$$A_t = e^{[\frac{0.3}{(8.62 \times 10^{-5} eV/K.)(300° K.)} - \frac{0.3}{(8.62 \times 10^{-5})(42.3° K.)}]} = 29.4$$

$$A_V = e^{2[6.5-5.0]} = 20$$

$$A_t \cdot A_V = 588$$

(from the Micron Semiconductor, Inc., Quality/Reliability Handbook, 1993, p. 37.)

By this analysis, military burn-in provides a time acceleration factor of 588X.

In comparison, stress voltage beyond 6.5 V provides increased acceleration. Taking voltage= 8.0 V in a 5 V nominal part and using the same equation (note—no temperature acceleration factor):

$$A_V = e^{2[8-5]} = 403$$

Voltage alone at 160% of $V_{DD}$=5 V provides acceleration nearly that of military burn-in. Voltage $V_S$ of 9 V gives:

$$A_V = e^{2[9-5]} = 2981$$

which is five times the military burn-in acceleration factor.

TDDB breakdown is oxide breakdown either in an intrinsic wearout or defect-related fashion. An oxide defect is known to increase current in an MOS device and also contributes to bridging defects in intermetal oxides, which are detected by current ($I_{DDQ}$) measurement. Sensitive current measurement (under 1 µA capability at a reasonable vector rate (1 kHz or faster) with a high node toggle coverage and bridge coverage vector set, running at a stress voltage can expose and detect defects such as these, which are the most common defects in CMOS devices today.

I claim:

1. A method for failure testing fully static CMOS integrated circuits (IC) having a plurality of nodes comprising:

stress testing the integrated circuit with a vector set of voltage inputs to the supply and input pins of the IC which toggles a maximum number of nodes in the IC on and off and tests a maximum number of bridges between nodes by driving the nodes on either side of the bridge to opposite logic values, the vector set of voltage inputs for this stress test being at least 25% higher than the normal voltages to the respective pins;

measuring the quiescent supply current ($I_{DDQ}$) during the stress test of the IC; and identifying failed IC's by the amount the $I_{DDQ}$ measured during the stress test exceeds a known value derived from good IC's.

2. The method of claim 1, wherein the method is sufficiently accurate that burn-in testing of the IC is unnecessary and not performed as an additional step.

3. The method of claim 1, wherein individual values of $I_{DDQ}$ are measured for at least some of the individual vectors in the vector set.

4. The method of claim 1, wherein the stressing voltage is at least 50% higher than the normal voltage.

5. The method of claim 1, wherein the stressing voltage is less than a voltage level which will cause overstress of an otherwise good IC.

6. The method of claim 1, wherein the stress test of the IC by the vector set is preceded by a test of the IC by the vector set using normal voltage levels.

7. The method of claim 6, wherein the measured values of $I_{DDQ}$ for the stress test and the test at normal voltage levels are used to identify a failure in the IC.

8. The method of claim 1, wherein the stress test of the IC by the vector set is followed by a test of the IC by the vector set using normal voltage levels.

9. The method of claim 8, wherein the measured values of $I_{DDQ}$ for the stress test and the test at normal voltage levels are used to identify a failure in the IC.

10. The method of claim 1, wherein the stress test is run multiple times.

11. The method of claim 10, wherein the multiple runs are conducted at different stressing voltages.

12. The method of claim 10, wherein the multiple runs of the stress test are done in less than about 2 minutes.

13. The method of claim 1, wherein the test is conducted at an elevated temperature.

14. The method of claim 1, wherein the IC is considered as failed if any value of $I_{DDQ}$ measured during or after a stress test exceeds 700 nA.

15. The method of claim 1 wherein the integrated circuit is presented in a die on a wafer.

16. The method of claim 1 wherein the integrated circuit is presented as devices in a package.

* * * * *